United States Patent [19]
Yabe

[11] Patent Number: 6,118,718
[45] Date of Patent: Sep. 12, 2000

[54] SEMICONDUCTOR MEMORY DEVICE IN WHICH A BIT LINE PAIR HAVING A HIGH LOAD IS ELECTRICALLY SEPARATED FROM A SENSE AMPLIFIER

[75] Inventor: Yoshikazu Yabe, Tokyo, Japan

[73] Assignee: NEC Corporation, Tokyo, Japan

[21] Appl. No.: 09/440,321

[22] Filed: Nov. 12, 1999

[30] Foreign Application Priority Data

Nov. 13, 1998 [JP] Japan .................................. 10-324247

[51] Int. Cl.⁷ .................................................. G11C 7/02
[52] U.S. Cl. ...................... 365/207; 365/205; 365/189.01
[58] Field of Search ..................................... 365/203, 205, 365/207, 220, 189.01

[56] References Cited

U.S. PATENT DOCUMENTS

| | | | |
|---|---|---|---|
| 5,668,766 | 9/1997 | Bramnik | 365/205 |
| 5,841,716 | 11/1998 | Iwaki | 365/205 |

FOREIGN PATENT DOCUMENTS

| | | | |
|---|---|---|---|
| 254497 | 2/1990 | Japan | G11C 11/41 |
| 554638 | 3/1993 | Japan | G11C 11/401 |
| 887879 | 4/1996 | Japan | G11C 11/34 |

OTHER PUBLICATIONS

"1998 Symposium on VLSI Circuits", Wakayama et al IEEE Solid State Circuits Society; Jun. 11–13 1998; pp. 12–15.
"TP 9.1: A 110MHz Cache DRAM with Fast Copy Back Scheme" Dosaka et al.
1992 IEEE International Solid State Circuites Conference; Feb. 19, 20, 21 1992; pp. 148–149.

*Primary Examiner*—Vu A. Le
*Attorney, Agent, or Firm*—Hayes, Soloway, Hennessey, Grossman & Hage, P.C.

[57] ABSTRACT

When a minute electric potential difference on a bit line pair is transmitted to sense amplifier, a bit line pair having a high load is electrically separated from the sense amplifier, thereby performing amplification. Therefore, reading speed can be increased. Furthermore, a plurality of sense amplifier are provided corresponding to each bit line pair. While any of the sense amplifier amplifies the read data, data held in another sense amplifier are written to the memory cell through the corresponding bit line pair. Consequently, in the case where the writing and reading operations are carried out alternately, the delay of a reading operation start period can be reduced during the writing operation. Consequently, it is possible to implement a memory device capable of increasing reading speed and reducing the delay of the reading operation start period by the writing operation even if writing frequency is almost equal to reading frequency.

9 Claims, 11 Drawing Sheets

SEMICONDUCTOR MEMORY DEVICE IN WHICH A BIT LINE PAIR HAVING A HIGH LOAD IS ELECTRICALLY SEPARATED FROM A SENSE AMPLIFIER

BACKGROUND OF THE INVENTION

1. Field of the Invention

The present invention relates to a memory device capable of enhancing the access speed and access efficiency of a volatile/large capacity semiconductor memory LSI represented by a dynamic random access memory (DRAM) or the like.

2. Description of the Related Art

In a volatile/large capacity semiconductor memory, particularly, a dynamic random access memory (DRAM), a minute electric potential difference made between two pairs of signal lines (bit lines) to which the data input-output of a memory cell is connected is amplified by a sense amplifier, thereby reading data and rewriting the data broken during the reading. Furthermore, it is necessary to perform an operation (precharging) for setting the bit line pairs to have the same electric potential before the reading operation in order to obtain a minute electric potential difference. Therefore, a speed is generally increased with difficulty.

For example, the speed increasing technique of the volatile/large capacity semiconductor memory having the above-mentioned properties has been disclosed in the Document 1 "Shigetoshi Wakayama et al., "10-ns Row Cycle DRAM using Temporal Data Storage Buffer Architecture," 1998 Symposium on VLSI Circuits Digest of Technical Papers, pp. 12–15".

The technique disclosed in the Document 1 will be described below with reference to FIGS. 1 and 2. A memory cell 5 is arranged in a matrix to form a memory cell array 6. A word line 1 is connected to a gate of each memory cell 5. A precharge circuit 14 is controlled by a precharge signal 15, thereby initializing a bit line pair 12 to have the same electric potential. Thus, each memory cell 5 is precharged. The bit line pair 12 is connected to a sense amplifier (SA) 81 through a transfer gate 80, and a data line pair 13 is connected to the sense amplifier 81. The transfer gate 80 is controlled by a SA selecting signal 82, and the sense amplifier 81 is controlled by a SA activating signal 83.

In the technique thus disclosed, a minute electric potential difference made in the bit line pair 12 is amplified by the sense amplifier 81, thereby reading data. However, when the minute electric potential difference is made on the sense amplifier, a connection between the memory cell 5 and the sense amplifier 81 is cut off by using the transfer gate 80.

Consequently, the data in the broken memory cell is not rewritten. However, the bit line pair 12 having a high load is separated. Consequently, the amplification time of the sense amplifier 81 is shortened to increase a reading speed.

Moreover, another prior art has been disclosed in the Document 2 "Katsumi Dosaka et al., "A 100 MHz 4 MHz 4 Mb Cache DRAM with Fast Copy-Back Scheme," 1992 ISSCC Digest of Technical Papers, pp. 148–149". The technique (second prior art) described in the Document 2 will be described below ith reference to FIG. 3. In FIG. 3, the reference numerals 90 and 91 denote a SA selecting signal, the reference numerals 92 and 93 denote a SA activating signal, and the reference numerals 96 and 99 denote a bit line pair.

In this technique, as shown in FIG. 3, an amplifier (SA) 95 having a read data holding function and a write buffer (WB) 98 having a write data holding function are separately provided and are connected to the bit line pair 12 through an amplifier selecting switch 94 and a write buffer selecting switch 97, respectively.

In such a structure, the reading operation is carried out by first selecting the memory cell 5 by the word line 1 and then bringing the amplifier selecting switch 94 into a conductive state, thereby making a minute electric potential difference on the bit line pair 12 and the amplifier (RA) 95 having a read data holding function. Next, the minute electric potential difference is amplified by the amplifier (RA) 95 having a read data holding function, thereby reading data on a reading data output line 96 and rewriting the data into the memory cell.

On the other hand, the writing operation is carried out by temporarily holding data input from a writing data input line 99 in the write buffer (WB) 98 having a write data holding function. For a period in which the reading is not required, then, the memory cell is selected by the word line 1, thereby bringing the write buffer selecting switch into a conductive state to perform the writing. Therefore, a writing operation period can have flexibility by temporarily holding the write data. Thus, the writing operation can be hidden for a period in which the reading operation is not performed and can be therefore carried out easily. Consequently, the delay of a reading operation start time for the writing operation can be reduced. As a result, high-speed access can be carried out.

Although the reading speed can be increased and the delay time of the reading operation start period for the writing operation can be reduced in the above-mentioned conventional memory device, there has been the following problem.

In a processing to treat large capacity data which is represented by an image processing, so-called read-modify-write is frequently carried out, that is, data read from a memory device is processed and is immediately written to the memory device. In such a read-write manner, the reading and writing operations for the memory device are generated with almost the same frequency.

In the technique disclosed in the Document 1, accordingly, the reading speed can be increased but the writing speed cannot be increased. Therefore, the technique cannot cope with the read-modify-write. Moreover, the technique disclosed in the Document 2 is effective in the case where the reading frequency is greater than the writing frequency. However, in the case where the technique is applied to the read-modify-write in which the reading and writing operations are performed with almost the same frequencies, the writing operation cannot be hidden for the period in which the reading operation is not carried out. Therefore, the read-write cannot be performed at a high speed.

In the conventional memory device, thus, there has been a problem in that the delay time of the reading operation start period by the writing operation cannot be reduced in the case where the writing frequency and the reading frequency are almost equal to each other in order to increase a reading speed.

SUMMARY OF THE INVENTION

It is an object of the present invention to provide a memory device capable of reducing the delay time of a reading operation start period by a writing operation even if a writing frequency is almost equal to a reading frequency.

A first aspect of the present invention is directed to a memory device wherein a bit line pair having a high load is electrically separated from a sense amplifier to perform amplification when a minute electric potential difference on the bit line pair is transmitted to the sense amplifier.

A second aspect of the present invention is directed to a memory device comprising a plurality of sense amplifiers corresponding to each bit line pair, wherein while any of the sense amplifiers amplifies read data, data held in other sense amplifiers are written to memory cell through the corresponding bit line pair.

A third aspect of the present invention is directed to a memory device comprising a plurality of sense amplifiers for holding data obtained by amplifying a minute electric potential difference sent from memory cell during data reading and for writing the held data to the memory cell during data writing; and reading and writing control unit for performing control to bring a connection of each of the sense amplifiers and the memory cell into a conducive state or a cut off state, and for bringing a connection of the sense amplifier to be used for reading and the memory cell into a cut off state when receiving the minute electric potential difference from the memory cell and for bringing a connection of another sense amplifier holding write data and the memory cell into a conductive state, thereby writing the write data to the memory cell at the same time.

A fourth aspect of the present invention is directed to a memory device comprising a plurality of sense amplifiers for holding data obtained by amplifying a minute electric potential difference from memory cell; write buffer for writing the held data to the memory cell; and control unit for transferring the data held by the sense amplifier to the write buffer when reading the data from the memory cell, bringing a connection of the sense amplifier and the memory cell into a cut off state when the sense amplifier receives the minute electric potential difference from the memory cell and bringing a connection of the write buffer and the memory cell immediately after the cut off, thereby writing the data held in the write buffer to the memory cell.

A fifth aspect of the present invention is directed to the memory device according to the third or fourth aspect of the present invention, further comprising address converter for successively converting a logical address for a data request source such as an arithmetic unit provided on an outside or an inside to specify a data storage location into a physical address indicative of a storage location in a memory cell array for the logical address.

A sixth aspect of the present invention is directed to the memory device according to the third aspect of the present invention, wherein the data held in the sense amplifiers are written to the memory cell used for reading the data during data rewriting to be performed simultaneously with the next data reading.

A seventh aspect of the present invention is directed to the memory device according to the third aspect of the present invention, wherein the data held in the write buffers are written to the memory cell used for reading the data during data rewriting to be performed simultaneously with the next data reading.

According to the present invention, when the minute electric potential difference on the bit line pair is transmitted to the sense amplifier, the bit line pair having a high load is electrically separated from the sense amplifier, thereby performing amplification. Therefore, the reading speed can be increased. Furthermore, a plurality of sense amplifiers are provided corresponding to each bit line pair. While any of the sense amplifiers amplifies the read data, data held in another sense amplifier are written to the memory cell through the corresponding bit line pair. Consequently, in the case where the writing and reading operations are particularly carried out alternately, the delay of the reading operation start period can be reduced during the writing operation.

DESCRIPTION OF THE PREFERRED EMBODIMENTS

Preferred embodiments of the present invention will specifically be described below with reference to the accompanying drawings.

Figure 1:
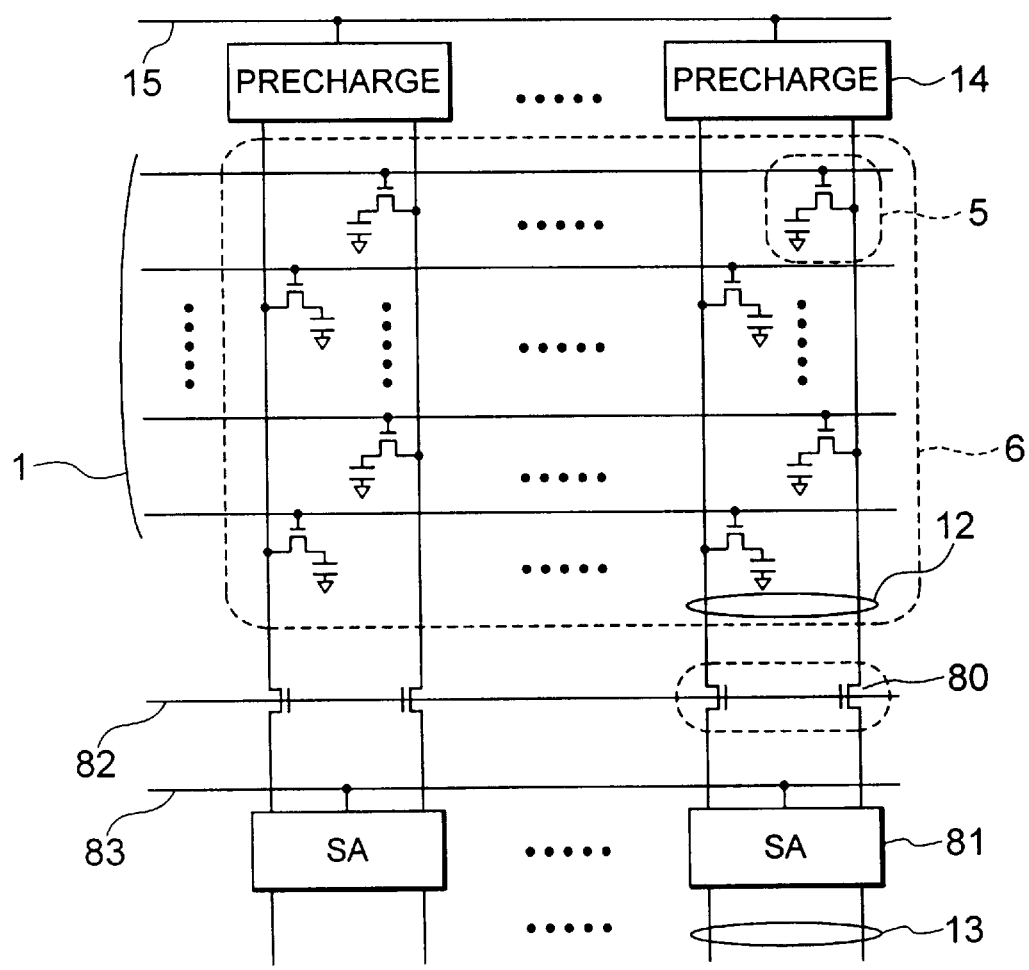
FIG. 1 is a diagram illustrating a conventional device.
Figure 2:
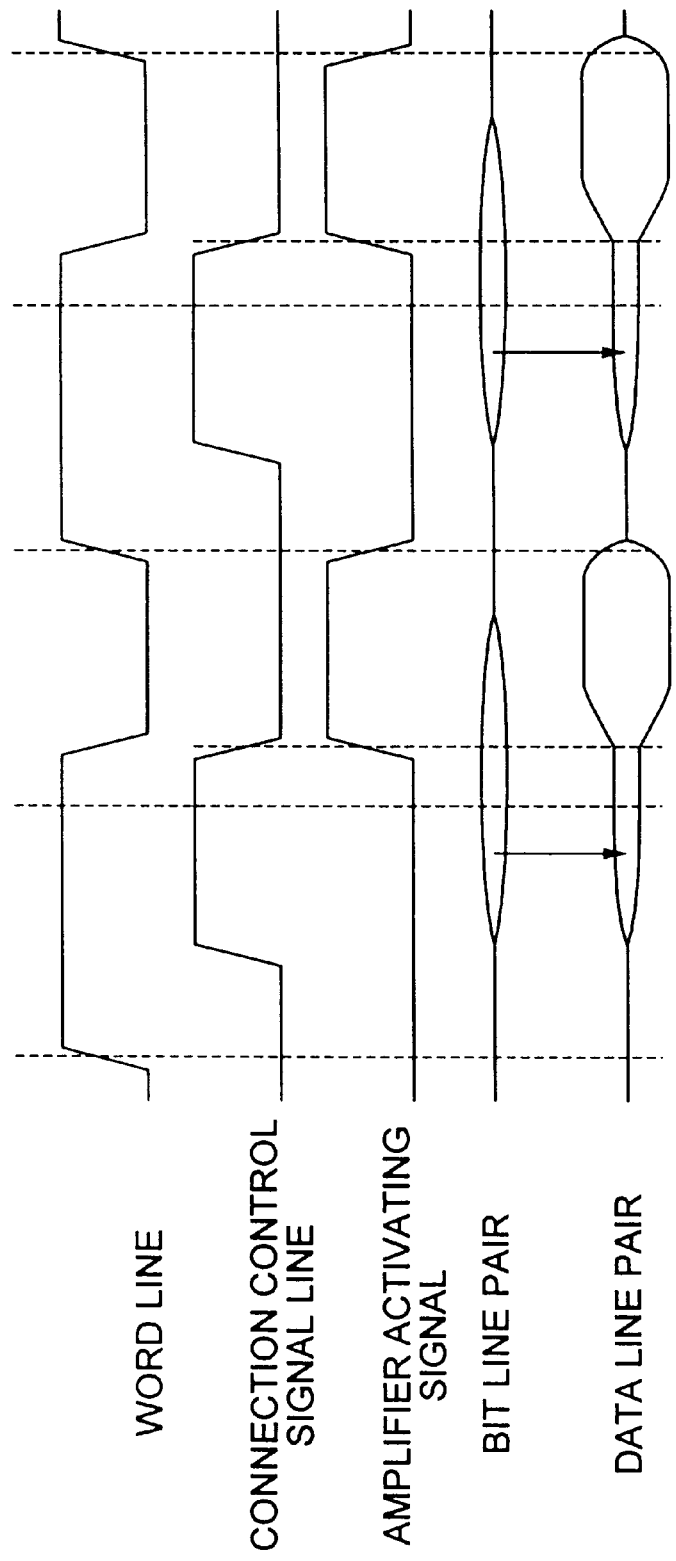
FIG. 2 is a diagram illustrating the conventional device.
Figure 3:
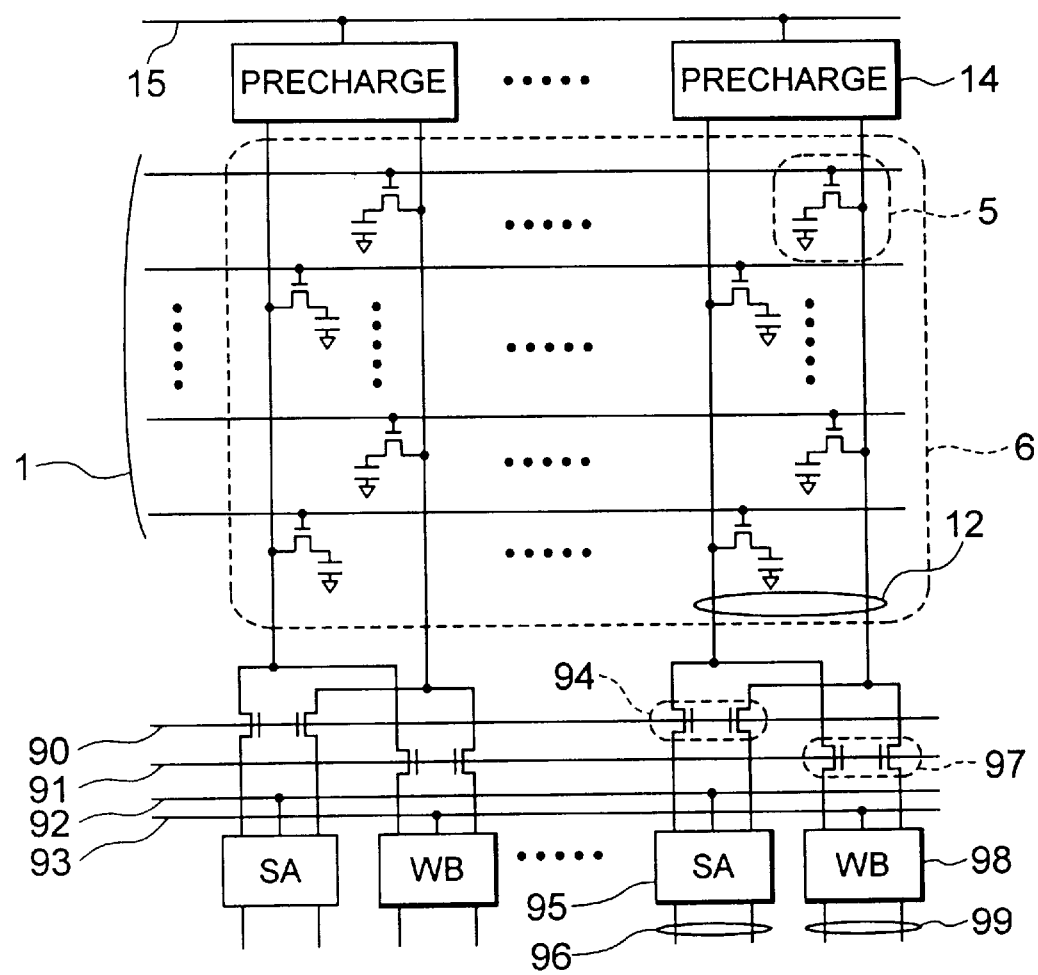
FIG. 3 is a diagram illustrating the conventional device.
Figure 4:
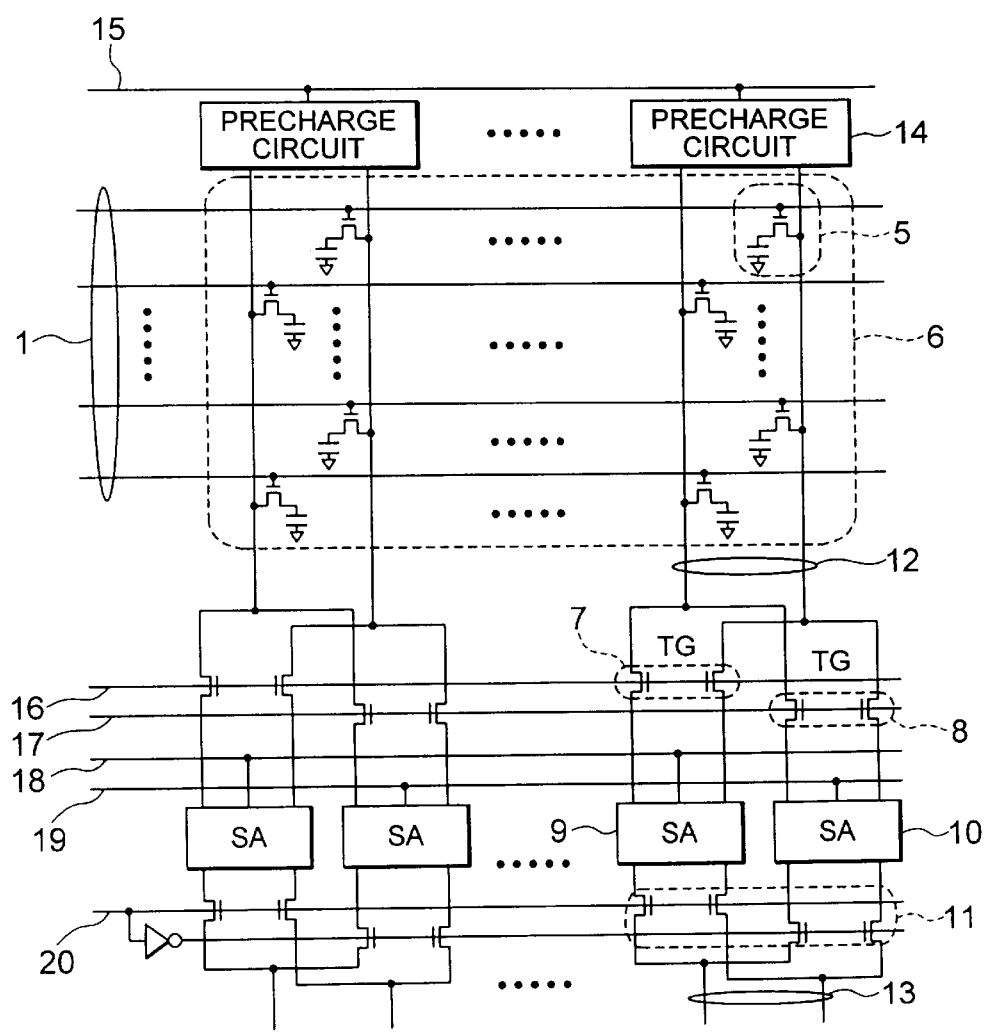
FIG. 4 is a circuit diagram showing a structure according to a first embodiment of the present invention.

First of all, a first embodiment of the present invention will be described. FIG. 4 is a circuit diagram showing the structure of a memory device according to the first embodiment. The memory device shown in FIG. 4 comprises a memory cell array 6, a transfer gate (which will be hereinafter referred to as a "TG") 7, a TG 8, an amplifier 9 having a data holding function (which will be hereinafter referred to as a "SA 9"), a SA 10, a data selector 11, a bit line pair 12, a data line pair 13 and a precharge circuit 14, and is controlled in response to a word line 1, a precharge signal 15, a SA 9 selecting signal 16, a SA 10 selecting signal 17, a SA 9 activating signal 18, a SA 10 activating signal 19 and a data output selecting signal 20.

The memory cell array 6 is constituted by a plurality of memory cells 5. Each memory cell 5 is connected to one word line and one bit line. Each memory cell 5 is selected to be used for reading or writing depending on a signal input to the word line to which the memory cell 5 is connected. The selected memory cell 5 performs data transfer by the bit line to which the memory cell 5 is connected. The precharge circuit 14 is controlled in response to the precharge signal 15, thereby performing an operation (precharging) for initializing the bit line pair 12 to have the same electric potential.

The TG 7 brings the connection of the bit line pair 12 and the SA 9 into a conductive state or a cut off state in response to the SA 9 selecting signal 16. Similarly, the TG 8 brings the connection of the bit line pair 12 and the SA into the conductive state or the cut off state in response to the SA 2 selecting signal 17.

The SA 9 and the SA 10 amplify a minute electric potential difference made on the bit line pair 12 in response to the SA 9 activating signal 18 and the SA 10 activating signal 19 and hold the data obtained after the amplification, respectively. The data selector 11 selects the data held in the SA 9 or the SA 10 and outputs the same data to the data line pair 13 in response to the data output selecting signal 20.

Next, an operation according to the first embodiment will be described with reference to FIG. 5. In the following description, it is assumed that the memory cell 5 is constituted by one capacitor and one transistor which are used in a dynamic random access memory (DRAM) and stores either of two states, that is, a high electric potential state (H level) and a low electric potential state (L level). Moreover, the signals 15 to 20 transit between the two states having the H and L levels, and are input according to the following definition.

More specifically, if the precharge signal 15 has the H level, the precharge circuit 14 initializes the bit line pair 12 to an intermediate electric potential (an intermediate level) between the H and L levels, respectively. On the other hand, if the precharge signal 15 has the L level, the precharge circuit 14 is electrically separated from the bit line pair 12.

If a signal (a word signal) input to the word line 1 has the H level, the memory cell 5 connected to the word line 1 is connected to a bit line, thereby reading or writing data. Moreover, if the word signal has the L level, the memory cell 5 connected to the same word line is electrically separated from the bit line, thereby holding data.

If the SA selecting signal 16 and the SA 10 selecting signal 17 have the H level, the SA 9 and the SA 10 are connected to the bit line pair 12, respectively. If the SA 1 selecting signal 16 and the SA 2 selecting signal 17 have the L level, the SA 9 and the SA 10 are electrically separated from the bit line pair 12, respectively.

If the SA 1 activating signal 18 and the SA 2 activating signal 19 have the H level, the SA 9 and the SA 10 amplify a minute electric potential difference made on the bit line pair 12 respectively and hold the data obtained after the amplification. On the other hand, if the SA 1 activating signal 18 and the SA 2 activating signal 19 have the L level, the SA 9 and the SA 10 are initialized respectively.

If the data output selecting signal 20 has the H level, the data amplified and held in the SA 9 are output to the data line pair 13. If the data output selecting signal 20 has the L level, the data amplified and held in the SA 10 are output to the data line pair 13.

Figure 5:
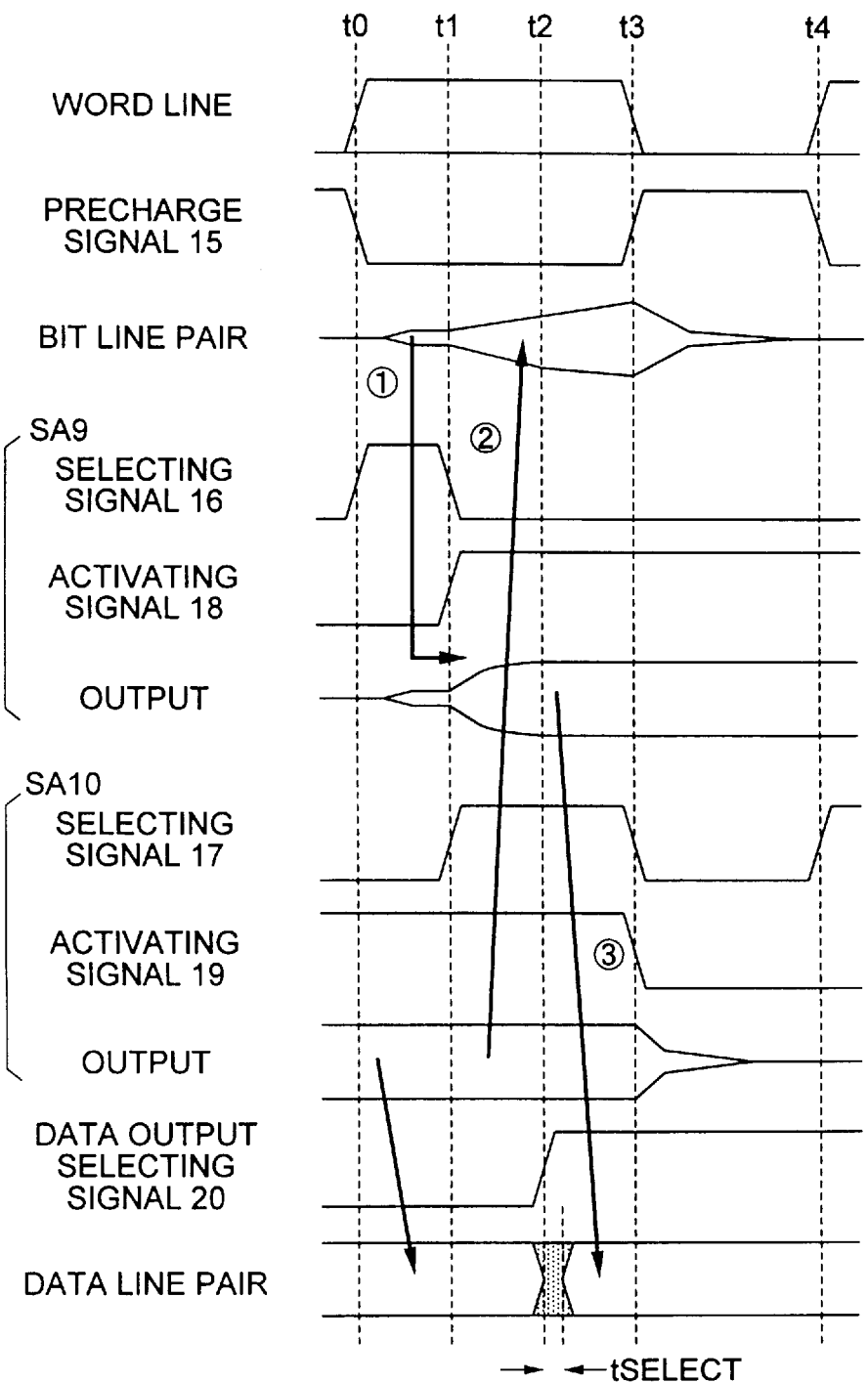
FIG. 5 is a timing chart illustrating an operation according to the first embodiment of the present invention.

In such a premise, in the case where data are first started to be read out at a time t0 as shown in FIG. 5, the bit line pair 12 and the SA 9 are initialized and the data are held in the SA 10 immediately before the time t0. At the time t0, one of the word lines connected to the memory cell array 6 transits from the L level to the H level, thereby setting the other word lines to the L level. Consequently, the memory cell 5 connected to the word line which has transited to the H level is connected to the bit line. Thus, the electric potential of electric charges stored in the memory cell 5 is slightly changed. As a result, a minute electric potential difference is made on the bit line pair 12 at a time t1.

Between the time t0 and the time t1 (which will be hereinafter referred to as a "t0–t1 period"), the SA 9 selecting signal 16 has the H level. Therefore, the minute electric potential difference made on the bit line pair 12 is also transmitted to the SA 9.

The SA 9 selecting signal 16 transits to the L level at the time t1, and the SA 10 selecting signal 17 and the SA 9 activating signal 18 transit to the H level. Therefore, the data held in the selected memory cell 5 are amplified and held by the SA 9 (an arrow (1) in FIG. 5), and the data held in the SA 10 are written to the selected memory cell (an arrow (2) in FIG. 5).

Then, the data output selecting signal 20 transits to the H level at a time t2, and the data amplified by the SA 9 are correspondingly read to the data line pair 13 (an arrow (3) in FIG. 5). Subsequently, the precharge signal 15 transits to the H level, and the SA 10 selecting signal 17 and the SA 10 activating signal 19 transit to the L level at a time t3. Consequently, the bit line pair 12 and the SA 10 are initialized.

At a time t4, the initialization of the bit line pair 12 and the SA 10 is completed and the states of the SA 9 and the SA 10 are exchanged and are brought into the state obtained at the time t0. Consequently, the operation for the period t0–t4 can be subsequently performed by replacing the control unit of the SA 9 and SA 10.

More specifically, when the minute electric potential difference on the bit line pair is transmitted to the sense amplifier, the bit line pair having a high load is electrically separated from the sense amplifier and is amplified. Consequently, a reading speed can be increased. Furthermore, if a plurality of sense amplifiers are provided, the data held in another amplifier are written to the memory cell through the bit line pair while the read data are amplified. Thus, in the case where a writing frequency is almost equal to a reading frequency, particularly, the writing and reading operations are alternately generated, the delay of the reading operation start period can be reduced during the writing operation.

For example, assuming that the periods t0–t1, t1–t2, t1–t3 and t3–t4 in FIG. 5 are set to 5 ns, 5 ns, 10 ns and 10 ns respectively, the reading and writing operations can be performed at 25 ns in the present invention (only the reading operation can be carried out at 10 ns).

Accordingly, in the case where the above-mentioned assumption is applied to the prior art according to the Document 1, it takes 10 ns for the reading operation and 25 ns for the writing operation. If the reading and writing operations are continuously carried out, 10 ns+25 ns=35 ns is required. Therefore, it is apparent that a processing speed can be increased by about 30% in the present invention.

Figure 6:
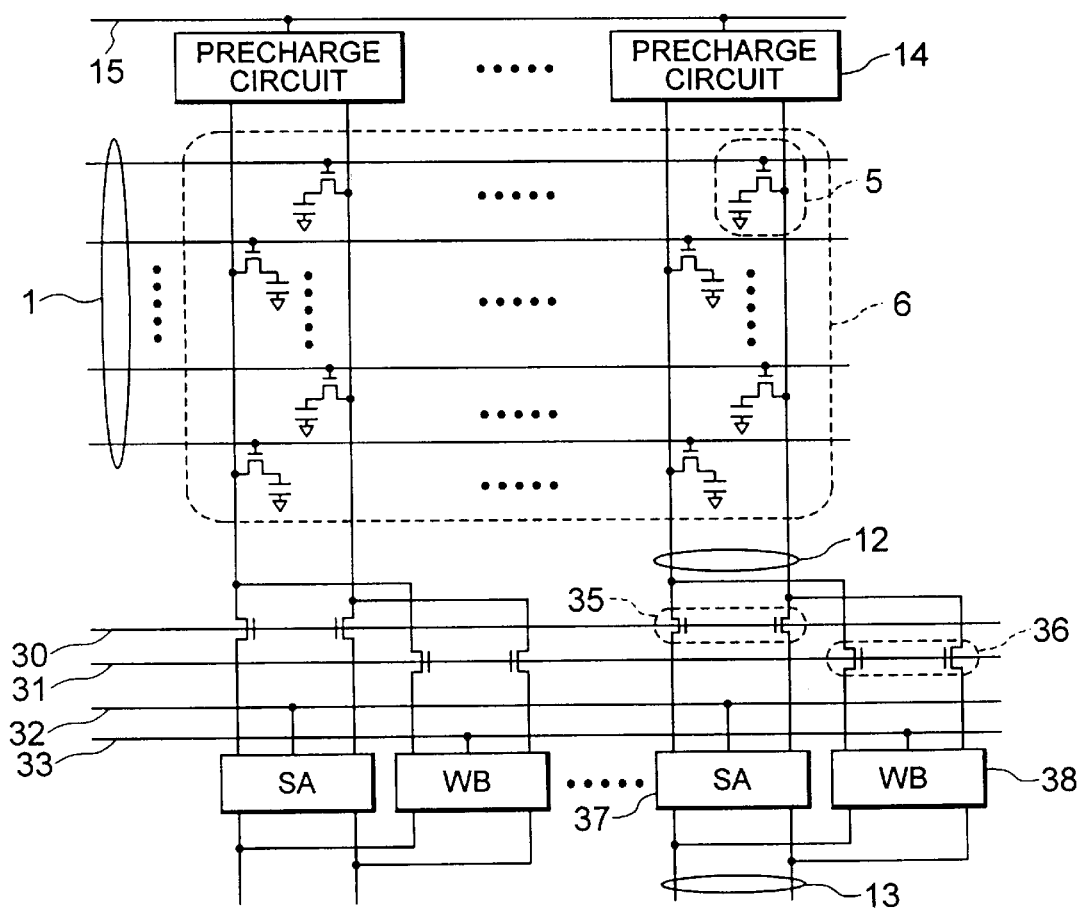
FIG. 6 is a circuit diagram showing a structure according to a second embodiment of the present invention.
Figure 7:
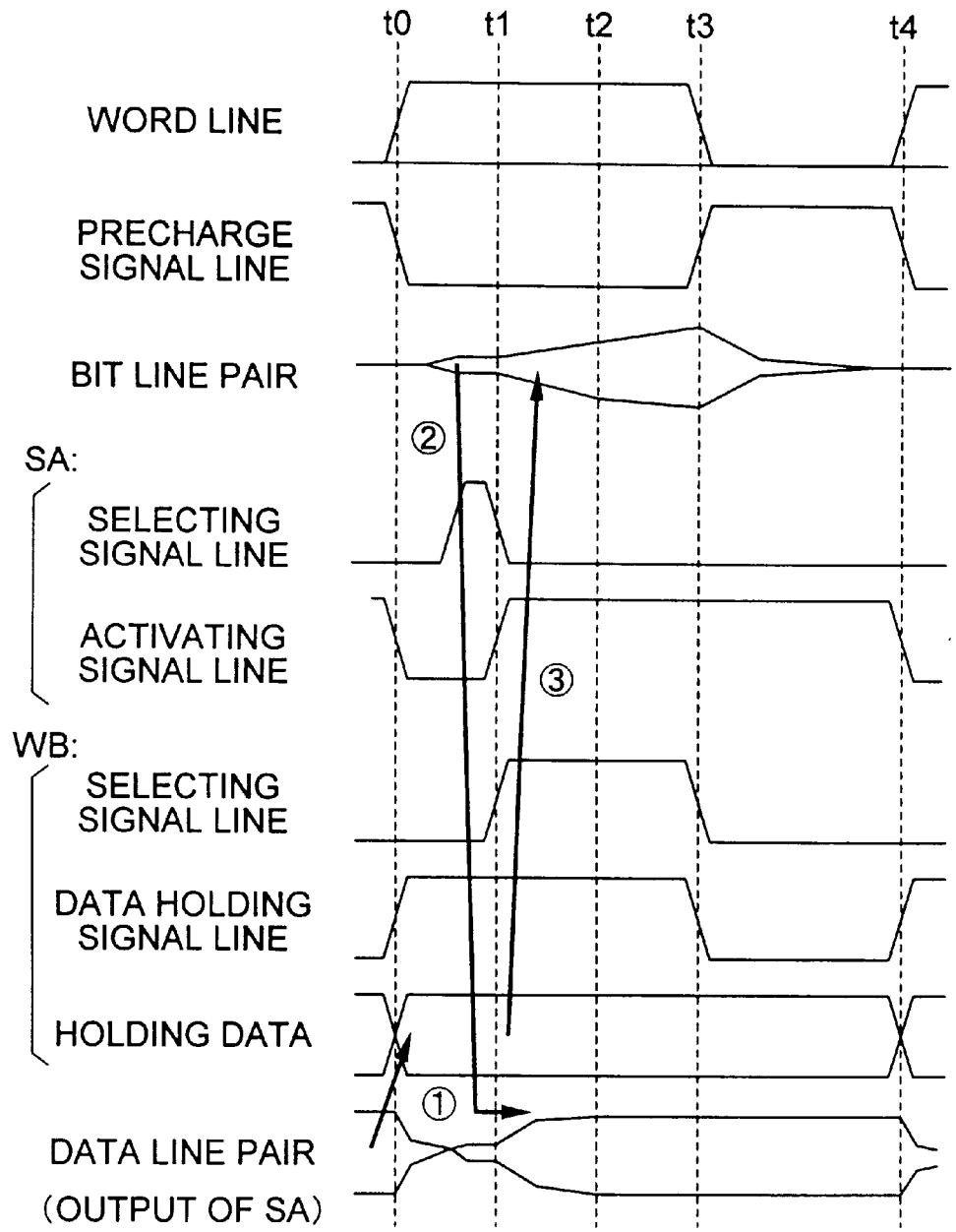
FIG. 7 is a timing chart illustrating an operation according to the second embodiment of the present invention.

Next, a second embodiment of the present invention will be described. FIGS. 6 and 7 are a circuit diagram and a waveform diagram which show the second embodiment, respectively. A structure according to the second embodiment shown in FIG. 6 is different from the structure according to the above-mentioned first embodiment (see FIG. 4) in that a write buffer (hereinafter referred to as a "WB") 38 having a data holding function is provided and the data selector 11 (see FIG. 4) is omitted.

The structure which is different from the structure according to the first embodiment will be described below and repetitive portions will be omitted. The WB 38 serves to hold the data held in a SA 37 in response to a data holding signal 33, and is driven by a WB selecting switch 36. The WB selecting switch 36 serves to bring the connection of a bit line pair 12 and the WB 38 into a conductive state or a cut off state in response to a WB selecting signal 31.

In the second embodiment having such a structure, in the case where data are first started to be read out at a time t0, the bit line pair 12 is initialized to have an intermediate level immediately before the time t0 and the data read by the previous operation are held in the SA 37 as shown in FIG. 7.

At the time t0, one of a plurality of word lines connected to a memory cell array 6 is caused to transit from the L level to the H level and the other word lines are fixed to the L level. Consequently, a memory cell 5 connected to the word line which has transited to the H level is connected to a bit line. As a result, the electric potential of electric charges stored in the memory cell 5 is slightly changed so that a minute electric potential difference is made on the bit line pair 12 at a time t1.

Furthermore, the data holding signal 33 transits from the L level to the H level at the time t0, and a SA activating signal 32 transits to the L level. Therefore, the data held in the SA 37 are held in the WB 38 (an arrow (1) in FIG. 7) and the SA 37 starts initialization.

At the time t1, a SA selecting signal 30 transits to the L level and the SA activating signal 32 and a WB selecting signal 31 transits to the H level. Therefore, the data held in the selected memory cell 5 are amplified and held by the SA 37 (an arrow (2) in FIG. 7). On the other hand, the data held in the WB 38 are written to the selected memory cell (an arrow (3) in FIG. 7).

Then, a precharge signal 15 transits to the H level and the WB selecting signal 31 transits to the L level at a time t3. Consequently, the initialization of the bit line pair 12 is started. At a succeeding time t4, the initialization of the bit line pair 12 is completed to return to the state obtained at the time t0.

According to the second embodiment, thus, a reading speed can be increased and the speed of the reading and writing operations to be continuously performed can be enhanced in the same manner as in the above-mentioned first embodiment.

As compared with the first embodiment, the data selector 11 is omitted. Therefore, the reading time can be shortened by the processing time of the data selector 11 (t Select shown in FIG. 5).

As compared with the first embodiment, furthermore, the reading circuit (SA 37) and the writing circuit (WB 38) can be individually designed in the second embodiment. Therefore, it is also possible to obtain the effect of shortening the writing time (a period t1–t3 shown in FIG. 7) without changing the reading time (a period t0 to t2 shown in FIG. 7).

Figure 8:
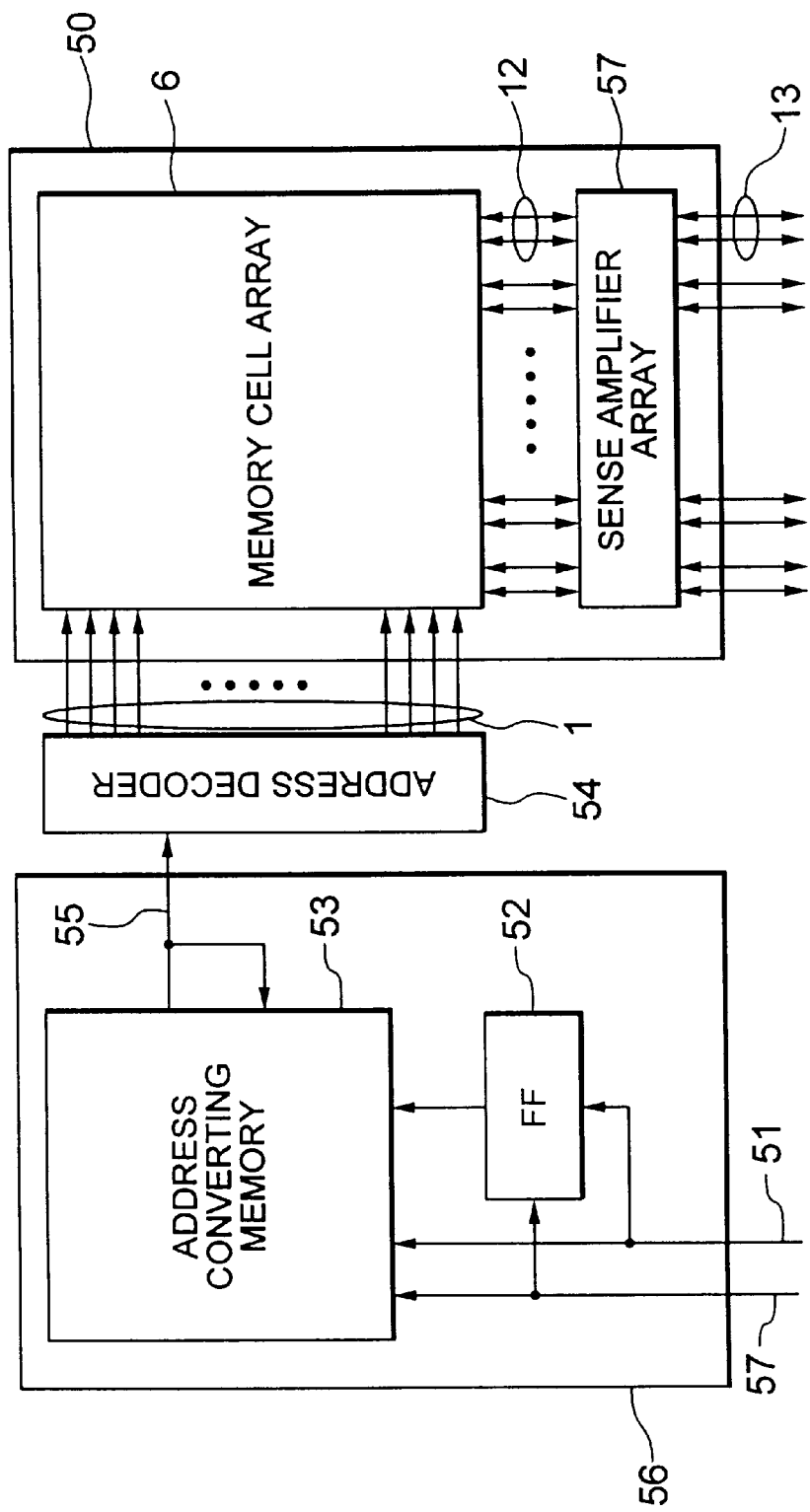
FIG. 8 is a circuit diagram showing a structure according to a third embodiment of the present invention.

Next, a third embodiment of the present invention will be described. FIG. 8 is a circuit diagram showing a structure according to the third embodiment. The structure according to the third embodiment shown in FIG. 8 comprises a memory core 50, an address converting circuit 56, an address decoder 54, a logical address signal 51 and a physical address signal 55 corresponding to the memory device according to the above-mentioned first or second embodiment.

The logical address signal 51 is a logical address for a data request source such as an arithmetic unit provided on the outside or the inside to specify a data storage location. The address converting circuit 56 successively and automatically updates a physical address indicative of an actual storage location in a memory cell array for the input logical address, and outputs the updated physical address as a physical address signal 55.

The address decoder 54 outputs a signal for operating a memory cell connected to one word line corresponding to the physical address. The address converting circuit 56 is constituted by an address converting memory 53 and an address holding circuit 52 as shown, for example.

The address holding circuit 52 is controlled in response to a clock signal 57 and holds a logical address. The address converting memory 53 stores a physical address corresponding to the logical address.

An operation according to the third embodiment having the above-mentioned structure will be described with reference to FIG. 9. The address converting memory 53 performs a reading operation when the clock signal 57 has the H level, and performs a writing operation when the clock signal 57 has the L level. Moreover, the address converting memory 53 holds a physical address. A storage location for the physical address is specified in response to the logical address signal 51 during the reading and to the output of the address holding circuit 52 during the writing. The address holding circuit 52 holds the logical address signal 51 and causes an output to transit when the clock signal 57 transits from the L level to the H level.

It is assumed that the address converting memory 53 stores physical addresses a0, b0 and c0 in locations specified by logical addresses a, b and c in a state obtained immediately before a time t0. In the following, for the sake of convenience, a data region in the address converting memory 53 specified by a logical address x will be indicated as M[x].

Figure 9:
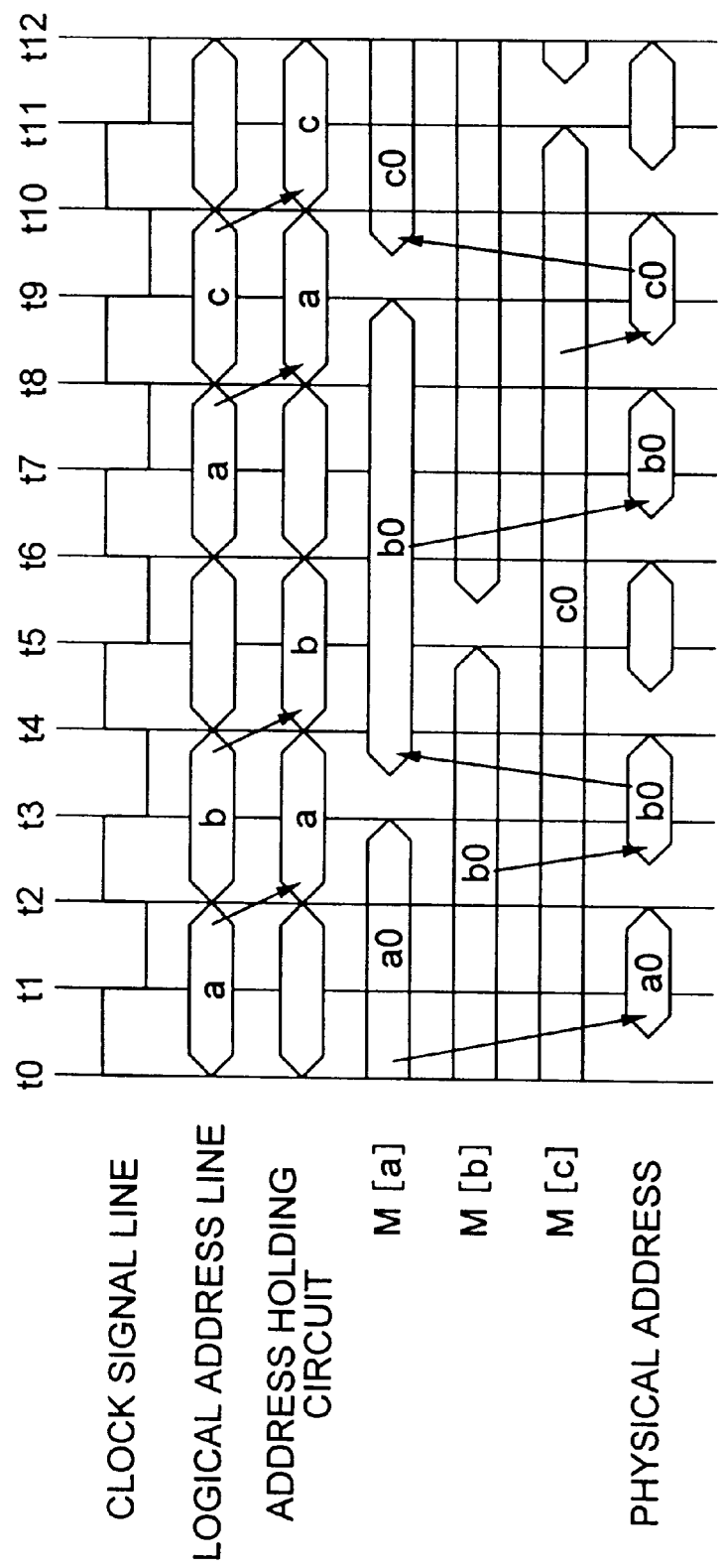
FIG. 9 is a timing chart illustrating an operation according to the third embodiment of the present invention.

As shown in FIG. 9, first of all, the logical address a is input as the logical address signal 51 for a period t0–t1, and the physical address a0 is output as the physical address signal 55 from the address converting memory 53. At a time t2, the logical address a is held by the address holding circuit 52.

For a period t2–t3, the logical address b is input as the logical address signal 51. Correspondingly, the physical address b0 is output as the physical address signal 55 from the address converting memory 53. For a period t3–t4, subsequently, the physical address b0 is written to the data region M[a] in the address converting memory 53. As shown in a period t6–t7, consequently, in the case where the logical address a is then input, the physical address b0 is output as the physical address signal 55. Thus, each time the logical address is used, the physical address corresponding to the logical address can be replaced with the physical address used for the next access.

In other words, the previously read data are written to the memory cell which has read data in the above-mentioned first and second embodiments. In a data request source such as an arithmetic unit provided on the outside or the inside, therefore, in the case where the previously read data is to be read out again, it is necessary to previously calculate and specify the storage location for the data. In the third embodiment, however, a physical address corresponding to a logical address is automatically updated and output. Therefore, when the previous read data are to be read out again, it is not necessary to calculate the storage location for the data. Thus, a processing can be carried out at a high speed.

Next, a fourth embodiment of the present invention will be described with reference to FIGS. 10 and 11. A structure according to the fourth embodiment shown in FIG. 10 comprises a memory core 50, an address decoder 54 and a word signal generating circuit 65 corresponding to the memory device according to the above-mentioned first or second embodiment. A decode signal 64 output from the address decoder 54 is connected to separate word signal generating circuits 65, . . . , 65 respectively, and each word signal generating circuit 65 drives one word line 1.

An address signal 63 is an address for specifying a data storage location in a memory cell array 6 and serves to specify all memory cells connected to one word line. The address decoder 54 outputs the decode signal 64 for selecting one word signal generating circuit 65 in response to the address signal 63, and the word signal generating circuit 65 selected in response to the decode signal 64 outputs a control signal to the word line 1. Consequently, a memory cell connected to the word line is operated.

Next, an operation according to the fourth embodiment will be described with reference to FIG. 10. It is assumed that one decode signal 64 is set to the H level for the address signal 63, thereby selecting the word signal generating circuit 65 and the other decode signals 64 are set to the L level. The memory cell connected to the word line 1 performs the reading or writing operation when the connected word line 1 has the H level, and holds data when the connected word line 1 has the L level. Moreover, the memory device according to the above-mentioned second embodiment is assumed as the memory core.

Figure 10:
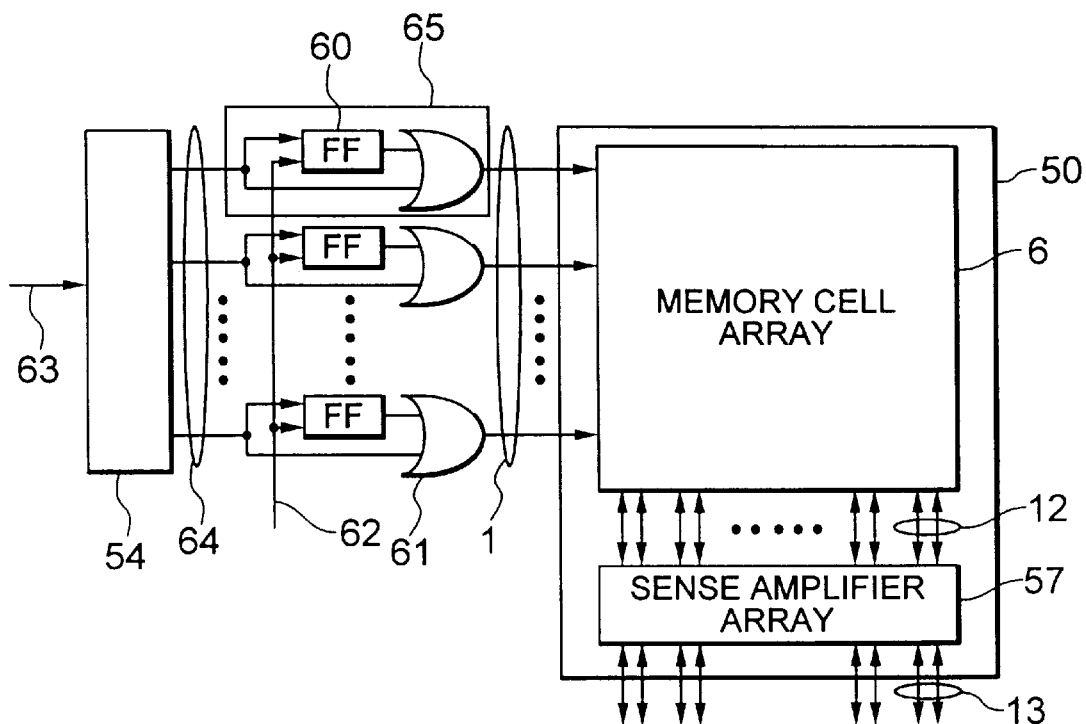
FIG. 10 is a circuit diagram showing a structure according to a fourth embodiment of the present invention.

The word signal generating circuit 65 can be implemented by combining a word holding circuit 60 and an OR circuit 61 as shown in FIG. 10, for example. The word holding circuit 60 holds the decode signal 64 when a clock signal 62 transits from the L level to the H level. The OR circuit 61 outputs the L level when the decode signal 64 and the output of the word holding circuit 60 have the L level, and outputs the H level in other cases.

Figure 11:
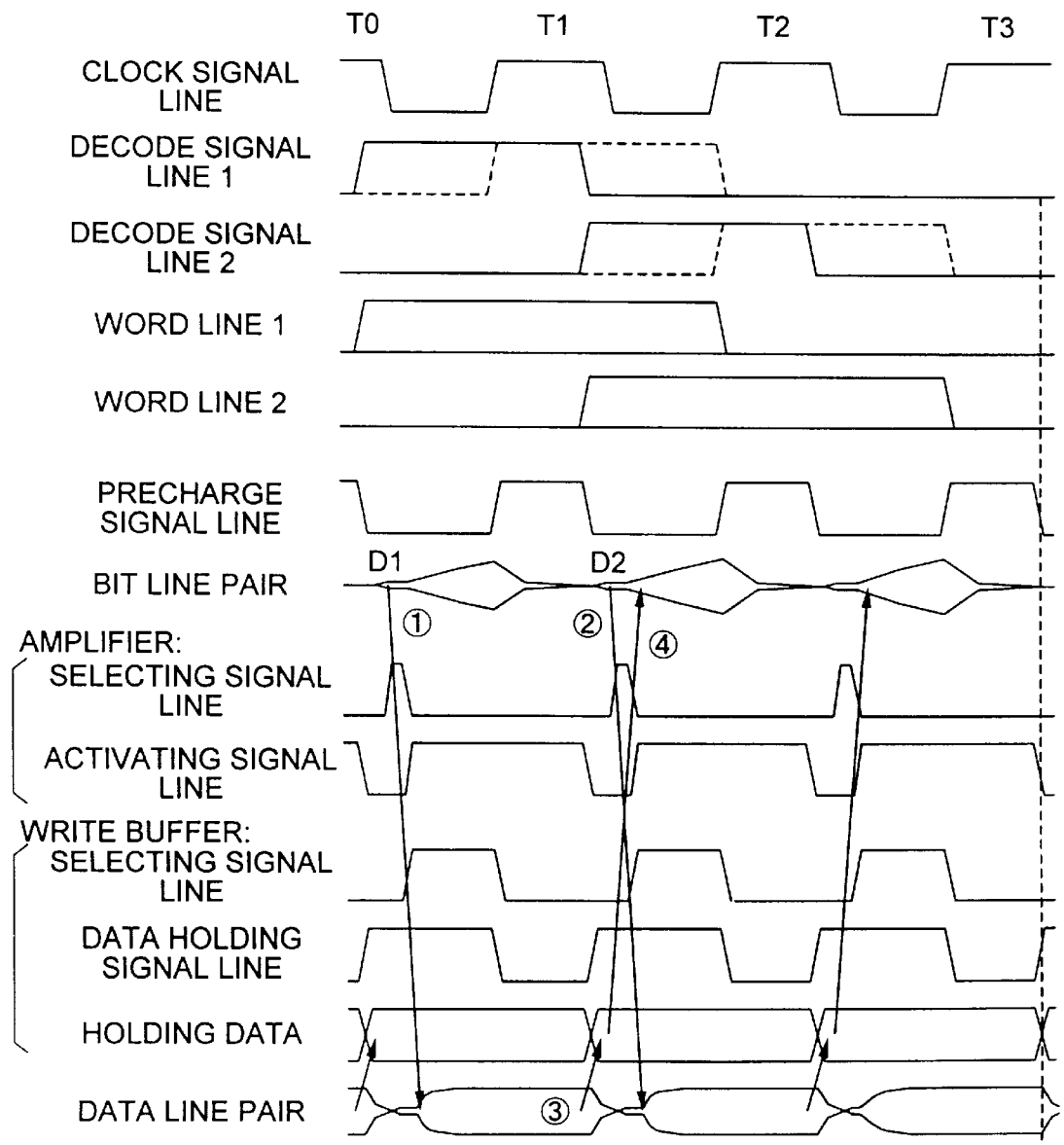
FIG. 11 is a timing chart illustrating an operation according to the fourth embodiment of the present invention.

Referring to a timing chart shown in FIG. 11, the period t0–t4 according to the second embodiment (see FIG. 7) is equivalent to each of periods T0–T1, T1–T2 and T2–T3 shown in FIG. 11. In response to the address signal 63, a decode signal line 1 transits to the H level at the time T0 and a decode signal line 2 transits to the H level at the time T1. The decode signal lines 1 and 2 are held by the word holding circuit 60 for a period shown in a broken line of FIG. 11. The word lines 1 and 2 are outputs of the word signal generating circuit 60 to which decode signal lines 1 and 2 are connected, respectively.

For the period T0–T1, a minute electric potential difference is made on a bit line pair by data (D1) in a memory cell connected to the word line 1, and is amplified and read out by an amplifier (an arrow (1) in FIG. 11). For the period T1–T2, similarly, a minute electric potential difference is made on the bit line pair by data (D2) in a memory cell connected to the word line 2, and is amplified and read out by the amplifier (an arrow (2) in FIG. 11). For the period T1–T2, simultaneously, the data D1 read out for the period T0–T1 are transferred to a write amplifier (an arrow (3) in FIG. 11), and are written into the memory cell connected to the word line 1 by using a bit line pair (an arrow (4) in FIG. 11).

In the above-mentioned first and second embodiments, the previously read data are written to the memory cell which has read data. In a data request source such as an arithmetic unit provided on the outside or the inside, therefore, in the case where the previous read data are to be read out again, it is necessary to calculate and specify the storage location for the data in advance. In the fourth embodiment, however, the read data are written to the same storage location when the next reading operation is performed. Therefore, the calculation is not required. As data result, a processing can be carried out at a high speed.

According to the present invention, as described above, when the minute electric potential difference on the bit line pair is transmitted to the amplifier (sense amplifier), the bit line pair having a high load is electrically separated from the amplifier (sense amplifier), thereby performing amplification. Furthermore, a plurality of amplifiers are provided. While any of the amplifiers amplifies the read data, data held in another amplifier or the write buffer are written to the memory cell through the bit line pair. Consequently, in the case where the reading speed of a dynamic random access memory (DRAM) or the like is increased and the writing frequency and the reading frequency are almost equal to each other, particularly, the delay time of the reading operation start period by the writing operation can be reduced.

In the present invention, moreover, there is provided a unit for automatically updating and outputting a physical address for a logical address or control unit for writing the read data to the same storage location during the next reading operation. Therefore, in the case where the previously read data are to be read out again in the data request source such as an arithmetic unit provided on the outside or the inside, it is not necessary to calculate and specify the storage location for the data in advance. Thus, data processing can be carried out at a high speed.

What is claimed is:

1. A memory device comprising a plurality of sense amplifier corresponding to each bit line pair, in which while any of the sense amplifiers amplifies read data, data held in other sense amplifier are written to a memory cell through the corresponding bit line pair.

2. A memory device comprising:

a plurality of sense amplifiers for holding data obtained by amplifying a minute electric potential difference sent from a memory cell during data reading and for writing the held data to the memory cell during data writing; and reading and writing control unit for performing control to bring a connection of each of the sense amplifier and the memory cell into a conductive state or a cut off state, and for bringing a connection of the sense amplifier to be used for reading and the memory cell into a cut off state when receiving the minute electric potential difference from the memory cell and for bringing a connection of another sense amplifier holding write data and the memory cell into a conductive state, thereby writing the write data to the memory cell at the same time.

3. A memory device comprising:

a plurality of sense amplifiers for holding data obtained by amplifying a minute electric potential difference from a memory cell;

a write buffer for writing the held data to the memory cell; and a control unit for transferring the data held by the sense amplifier to the write buffer when reading the data from the memory cell, bringing a connection of the sense amplifier and the memory cell into a cut off state when the sense amplifier receives the minute electric potential difference from the memory cell and bringing a connection of the write buffer and the memory cell immediately after the cut off, thereby writing the data held in the write buffer to the memory cell.

4. The memory device according to claim 2, further comprising an address converter for successively converting a logical address for a data request source provided on an outside or an inside to specify a data storage location into a physical address indicative of a storage location in a memory cell array for the logical address.

5. The memory device according to claim 3, further comprising an address converter for successively converting a logical address for a data request source provided on an outside or an inside to specify a data storage location into a physical address indicative of a storage location in a memory cell array for the logical address.

6. The memory device according to claim 2, wherein the data held in the sense amplifiers are written to the memory cell used for reading the data during data rewriting to be performed simultaneously with the next data reading.

7. The memory device according to claim 3, wherein the data held in the write buffer are written to the memory cell used for reading the data during data rewriting to be performed simultaneously with the next data reading.

8. The memory device according to claim 4, wherein the data request source comprises an arithmetic unit.

9. The memory device according to claim 5, wherein the data request source comprises an arithmetic unit.

* * * * *